(12) United States Patent
Arshad et al.

(10) Patent No.: US 7,531,432 B2
(45) Date of Patent: May 12, 2009

(54) BLOCK-MOLDED SEMICONDUCTOR DEVICE SINGULATION METHODS AND SYSTEMS

(75) Inventors: Mohamad Ashraf Bin Mohd Arshad, Kuala Lumpur (MY); Yue Seng Fatt, Selangor (MY)

(73) Assignee: Texas Instruments Incorporated, Dallas, TX (US)

( * ) Notice: Subject to any disclaimer, the term of this patent is extended or adjusted under 35 U.S.C. 154(b) by 155 days.

(21) Appl. No.: 11/674,862

(22) Filed: Feb. 14, 2007

(65) Prior Publication Data

US 2008/0194081 A1     Aug. 14, 2008

(51) Int. Cl.
*H01L 21/00*     (2006.01)
(52) U.S. Cl. .............. 438/460; 438/112; 438/113; 438/464; 438/623; 257/E21.001
(58) Field of Classification Search .............. 438/112, 438/113, 464, 623; 257/E21.001, 666, 667, 257/664
See application file for complete search history.

(56) References Cited

U.S. PATENT DOCUMENTS

| | | | |
|---|---|---|---|
| 2008/0003718 A1* | 1/2008 | Estepa et al. | 438/113 |
| 2008/0119012 A1* | 5/2008 | Fan | 438/112 |
| 2008/0153208 A1* | 6/2008 | Matsunami | 438/112 |

* cited by examiner

*Primary Examiner*—Walter L Lindsay, Jr.
*Assistant Examiner*—Abdulfattah Mustapha
(74) *Attorney, Agent, or Firm*—Yingsheng Tung; Wade J. Brady, III; Frederick J. Telecky, Jr.

(57) ABSTRACT

The invention discloses methods and systems for singulation of block-molded arrays of semiconductor devices. Preferred embodiments include methods and associated systems for securing a block-molded array of semiconductor devices into a mounting ring with light-sensitive tape. Tape-deactivating is used to render exposed regions of the light-sensitive tape less tacky. The mounting ring containing the block-molded array is secured on a cutting table and the array is singulated into individual devices. Aspects of the invention also include the use of tape-deactivating light for making the light-sensitive tape less tacky to facilitate removal of the individual devices after singulation.

9 Claims, 4 Drawing Sheets

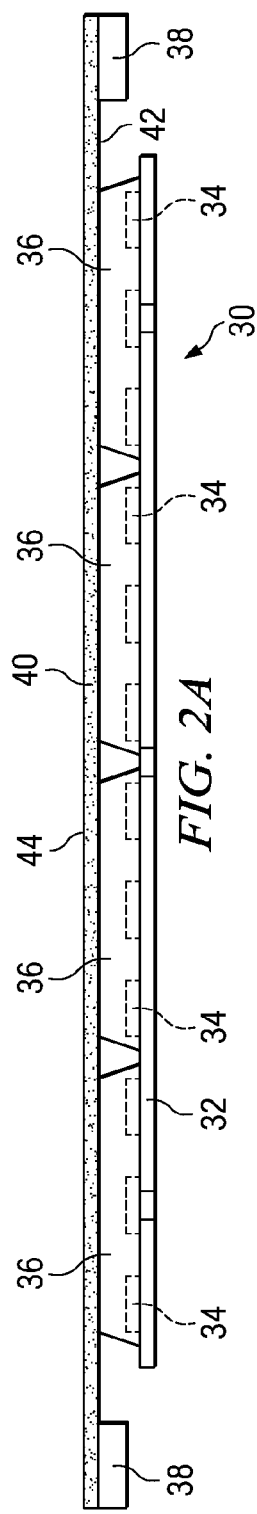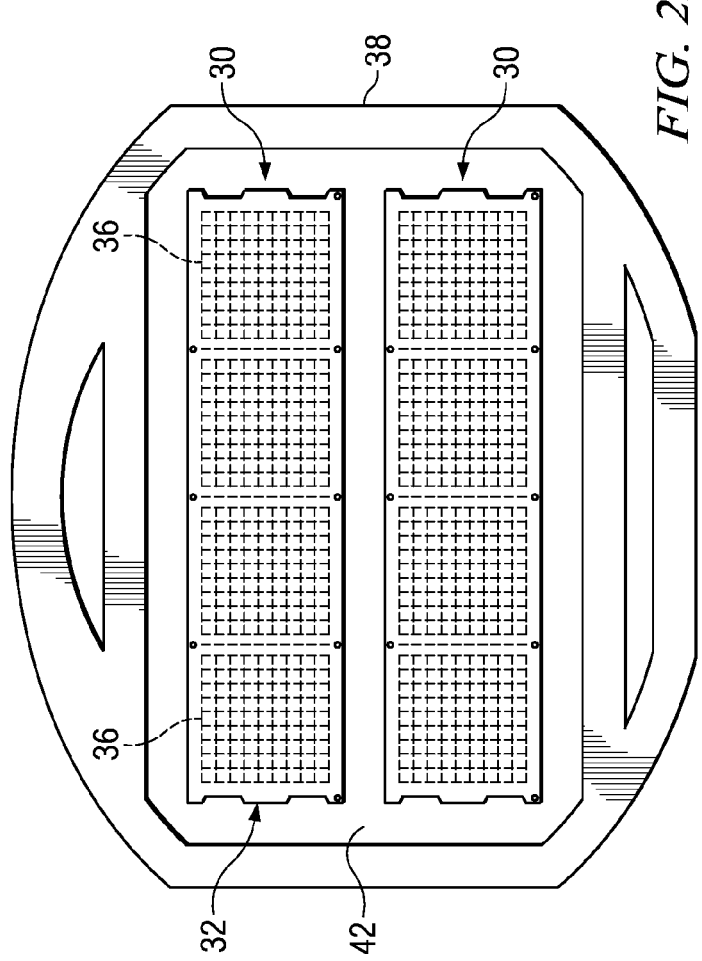

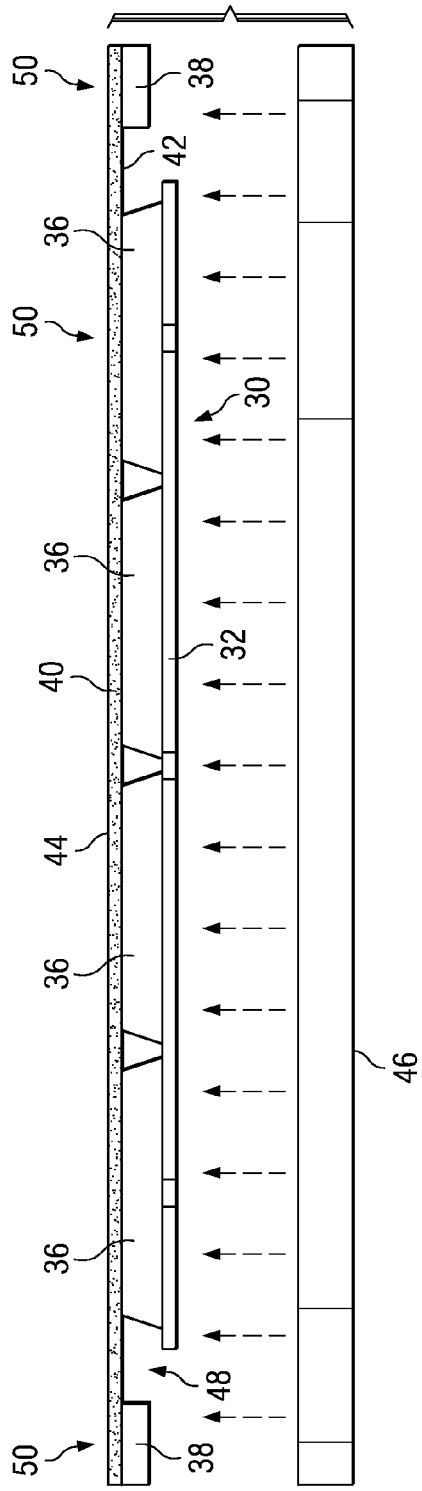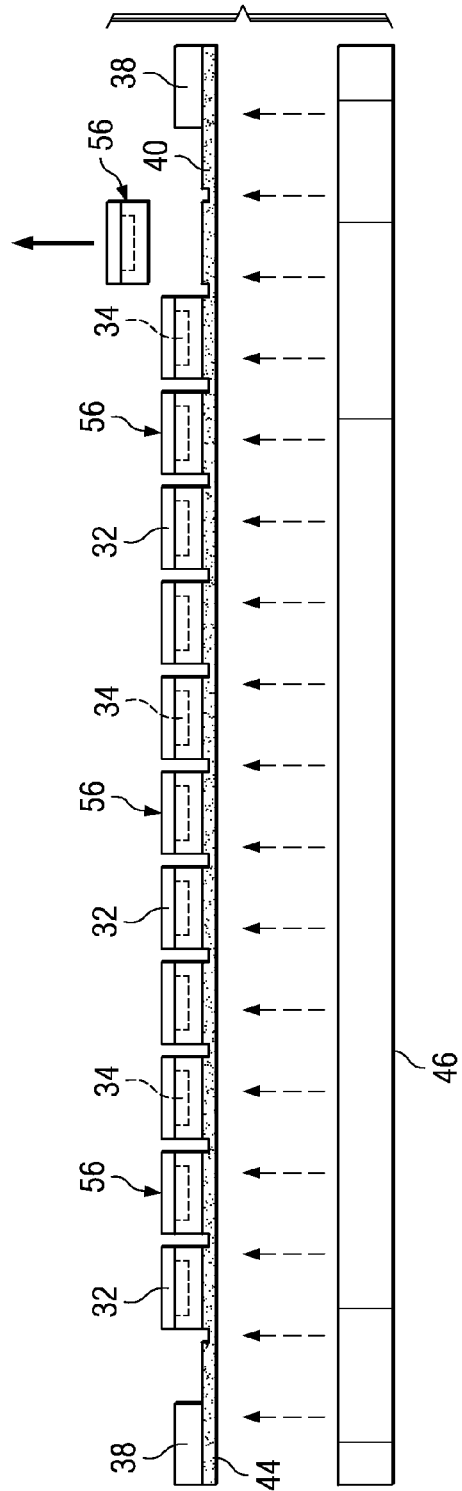

BLOCK-MOLDED SEMICONDUCTOR DEVICE SINGULATION METHODS AND SYSTEMS

TECHNICAL FIELD

The invention relates to electronic semiconductor devices and manufacturing. More particularly, the invention relates to systems and methods for cutting block-molded semiconductor device arrays in order to singulate individual devices.

BACKGROUND OF THE INVENTION

Semiconductor devices are constructed from a semiconductor material wafer through a process that includes a number of deposition, masking, diffusion, etching, implanting, and other steps. Usually, many individual devices are constructed on the same wafer. When the devices are separated into individual rectangular units, each takes the form of an integrated circuit die or chip. In order to connect a chip with other circuitry, it is common to mount it on a metallic leadframe or multi-layer substrate. Electrical connections are made and the assemblies are completed by encapsulating them in molded resin, plastic or ceramic packages that provide protection from hostile environments and yet enable electrical interconnection between the integrated circuit chip and an outside assembly such as a printed circuit board (PCB). In general, the elements of such a package include a substrate or leadframe, an integrated circuit chip, bonding material to attach the integrated circuit chip to the leadframe, electrical connections between the integrated circuit chip and the leadframe, and a hard encapsulant material which covers the other components and forms the exterior of the package.

For purposes of high-volume, low-cost production of IC packages, one current industry practice is to prepare, usually through a process of etching and/or stamping, a thin sheet of metal to form a panel or strip which defines multiple leadframes arranged in one or more arrays or strips. Multi-chip arrays may also be formed on semiconductor wafer material. In a common chip package manufacturing process, the integrated circuit chips are mounted to respective locations on the substrates, with the encapsulant material then applied to the strip or array so as to collectively encapsulate all of the integrated circuit chips, any bond wires used to connect the chips to the substrates, and all or regions of each of the substrates. The process of manufacturing "block-molded" semiconductor packages, wherein numerous chips on a strip or array are encapsulated within a single molded body, is widespread in the art. Subsequent to the curing of the encapsulant, the substrates and their associated chips and leads are then cut apart or singulated for purposes of producing the individual chip packages. One common technique by which singulation is typically accomplished is a saw singulation process. In this process, the array of block molded devices is held down on a cutting table, using a vacuum or mechanical jig, while a saw blade is advanced through the array in prescribed patterns between the block-molded chips as required to facilitate the separation of the individual packaged chips from one another.

In saw singulation processes using adhesive tape for securing workpieces, a block-molded strip or array of devices is ordinarily placed and secured atop a cutting table and sawn into individual device packages. Typically, a block-molded array of ICs is mounted in a mounting ring using adhesive tape. A cutting table or platform is used to support the mounting ring as it holds the block-molded array. The mounting ring is in turn held in place by an arrangement typically including a frame and a holding mechanism such as a vacuum-equipped cutting table designed for that particular purpose. A spindle assembly is positioned above the secured array and is used to bring a rotating saw blade into contact with the array for cutting. An optical device such as a camera is used to align and control the path of the saw blade. Nozzles positioned near the saw blade are typically used to cool the array and saw blade during sawing and for dispensing solvent such as high pressure water or soapy water to wash away sawdust particles and waste generated by the sawing process.

Saw singulation employing adhesive tape for securing block-molded devices is widely used. However, there are significant problems remaining in the present state of the art. For example, during saw singulation, sawdust including mold compound, silicon, metal, or other particles are typically generated by the cutting action of the saw. The sawdust has a tendency to settle on nearby surfaces such as the singulated devices and the remainder of the array(s) during further cutting. Additionally, scrap pieces, particularly at the edges of the arrays, are produced during cutting. The exposed areas of adhesive tape adjacent to the array(s) provides a tacky surface to which particles and scraps tend to adhere. Efforts to wash away adhering particles and scraps are not completely effective. As a result, scraps can impede sawing and damage or break the saw blade during further cutting. Also, particles of contaminants that become stuck to the tape can later become dislodged and can be transferred to completed devices during subsequent cleaning and handling. Due to the technical challenges and problems with the present state of the art, improved systems and methods for singulating block-molded semiconductor devices would be useful and advantageous in the arts. The present invention is directed to overcoming, or at least reducing the effects of, one or more of the problems described above.

SUMMARY OF THE INVENTION

In carrying out the principles of the present invention, in accordance with preferred embodiments thereof, systems and techniques for singulation of block-molded arrays of semiconductor devices make use of light-sensitive tape and corresponding selected-wavelength light sources for improving various handling and cutting steps of the manufacturing process.

According to one aspect of the invention, in a preferred embodiment, a method for singulating block-molded arrays of semiconductor devices includes a step of providing a mounting ring and securing a block-molded array of semiconductor devices in the mounting ring with light-sensitive tape. The array, mounting ring, and light-sensitive tape are exposed to tape-deactivating light such that exposed regions of the light-sensitive tape are made less tacky. The mounting ring containing the block-molded array is secured on a cutting table and the array is cut into individual devices.

According to another aspect of the invention, a step is included for exposing the taped side of the sawn block-molded array to tape-deactivating light for making the light-sensitive tape less tacky to facilitate removal of the singulated devices.

According to another aspect of the invention, the step of exposing the light-sensitive tape to tape-deactivating light, further includes the use of UV-sensitive tape and exposure to UV light.

According to yet another aspect of the invention, a system for singulating block-molded arrays of semiconductor devices employs a mounting ring to which a block-molded array of semiconductor devices is taped with light-sensitive tape. A tape-deactivating light source is provided whereby exposed regions of the light-sensitive tape may be made less tacky by the action of the tape-deactivating light. Cutting apparatus is used for securing the mounting ring containing the block-molded array and for singulating individual devices from the block-molded array.

According to another aspect of the invention, a system for singulating block-molded arrays of semiconductor devices includes cutting apparatus having a rotating saw blade.

According to still another aspect of the invention, preferred embodiments of systems for singulating block-molded arrays of semiconductor devices secure one or more block-molded arrays to a mounting ring using UV tape.

The invention has advantages including but not limited to providing methods and systems for singulating semiconductor devices with increased efficiency and reduced costs. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which:

FIG. 2A is a side view illustrating method steps and system components in an example of a preferred embodiment of the invention;

FIG. 2B is a planar view corresponding with FIG. 2A illustrating method steps and system components in the example introduced in FIG. 2A of a preferred embodiment of the invention;

FIG. 2C is a side view illustrating further method steps and system components according to the example of a preferred embodiment of the invention shown in and described with respect to FIGS. 2A and 2B;

FIG. 2E is a side view representative of an example of further steps in preferred embodiments of methods and systems for singulating block-molded semiconductor devices according to the invention as shown in and described with respect to FIGS. 2A through 2D.

References in the detailed description correspond to like references in the various Figures unless otherwise noted. Descriptive and directional terms used in the written description such as top, bottom, upper, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DETAILED DESCRIPTION OF PREFERRED EMBODIMENTS

Figure 1:
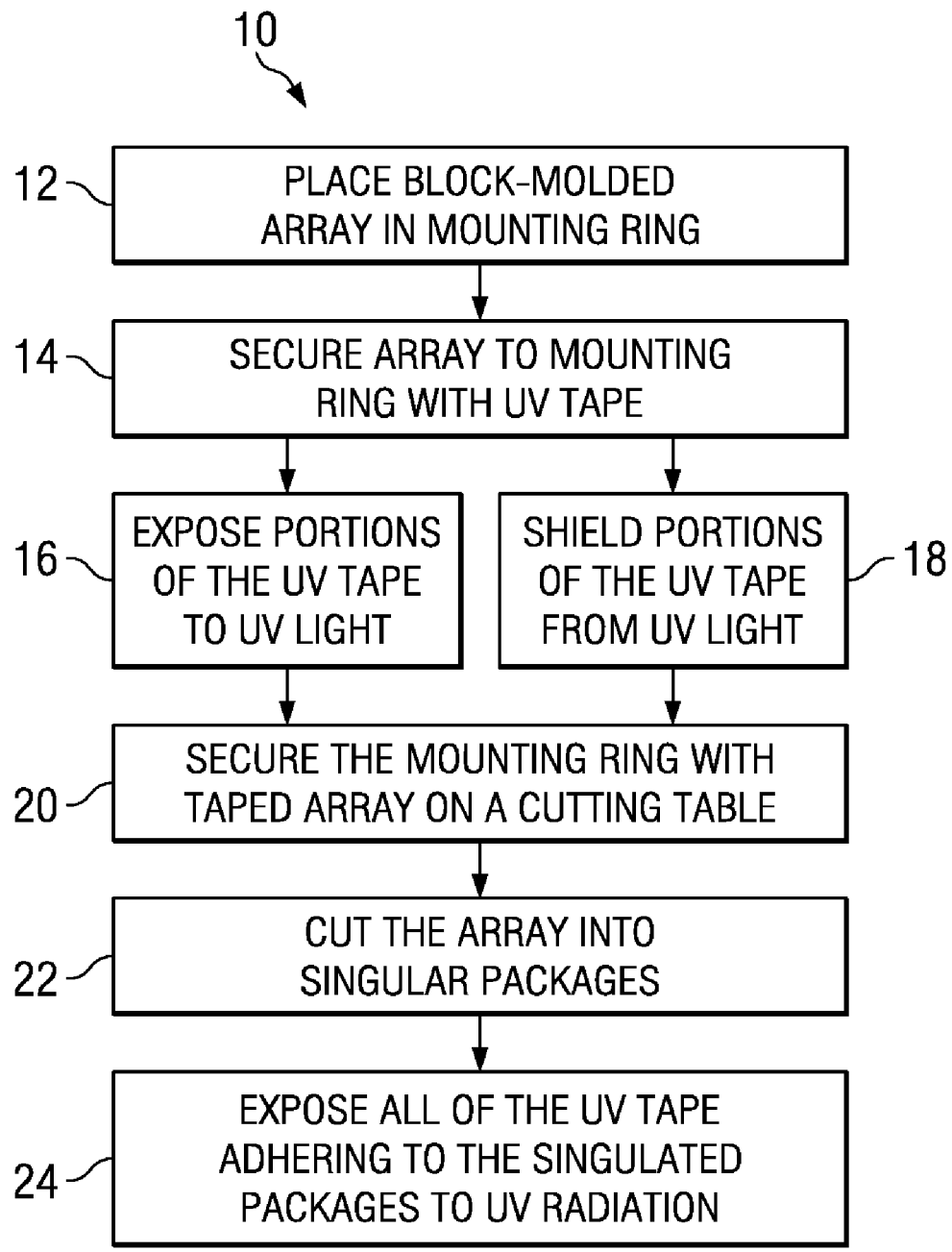
FIG. 1 is a process flow diagram providing and overview illustrating method steps in an example of preferred embodiments of the invention.

In general, the invention provides improved methods and systems for singulation of block-molded semiconductor devices in processes employing tape to secure block-molded devices for cutting, as used for example, in the manufacture of relatively small semiconductor packages, such as Quad Flat No-lead (QFN) packages. First referring primarily to FIG. 1, an example of the process flow 10 of preferred methods of the invention is shown. A block-molded array of semiconductor devices is placed in a framework, preferably such as a mounting ring of a type familiar in the arts 12. The block-molded array is secured to the mounting ring with light-sensitive tape 14, meaning tape whose adhesive properties can be reduced or eliminated by exposure to a selected portion of the electromagnetic spectrum, preferably ultra-violet (UV) in this exemplary embodiment. Referring now to boxes 16 and 18, respectively, the regions of the UV tape that are not covered by the block-molded array and mounting ring are exposed to UV light. Conversely, the presence of the block-molded array and mounting ring on the UV tape act to shield the underlying regions of the UV tape from the UV light. The UV light source intensity and exposure time are preferably sufficient to eliminate or substantially diminish the tackiness of the exposed regions of UV tape. Thereafter, as shown at step 20, the mounting ring, and tape holding the block-molded array, are secured on a cutting table in preparation for cutting. The individual packages are singulated from the array by cutting 22, preferably sawing, although other cutting techniques such as laser cutting may also be used. Singulated packages are then removed from the tape, and the tape from the mounting ring, after exposing the tape to UV light sufficient to cause the adhesive to cease adhering 24.

For convenience, the terms UV tape and UV light are used herein descriptive of the presently preferred embodiments of the invention. This convenience is adopted for the purposes of describing preferred implementations of the invention and is not intended to be restrictive. Although presently preferred embodiments of the invention use tape responsive to the UV portion of the electromagnetic spectrum, tapes responsive to other regions of the spectrum may alternatively be used within the principles of the invention. For example, the invention may be practiced using tape sensitive to other segments of the electromagnetic spectrum, such as infra-red (IR), or visible light, along with the substitution of a suitable source for emitting the selected wavelengths.

Figure 2D:
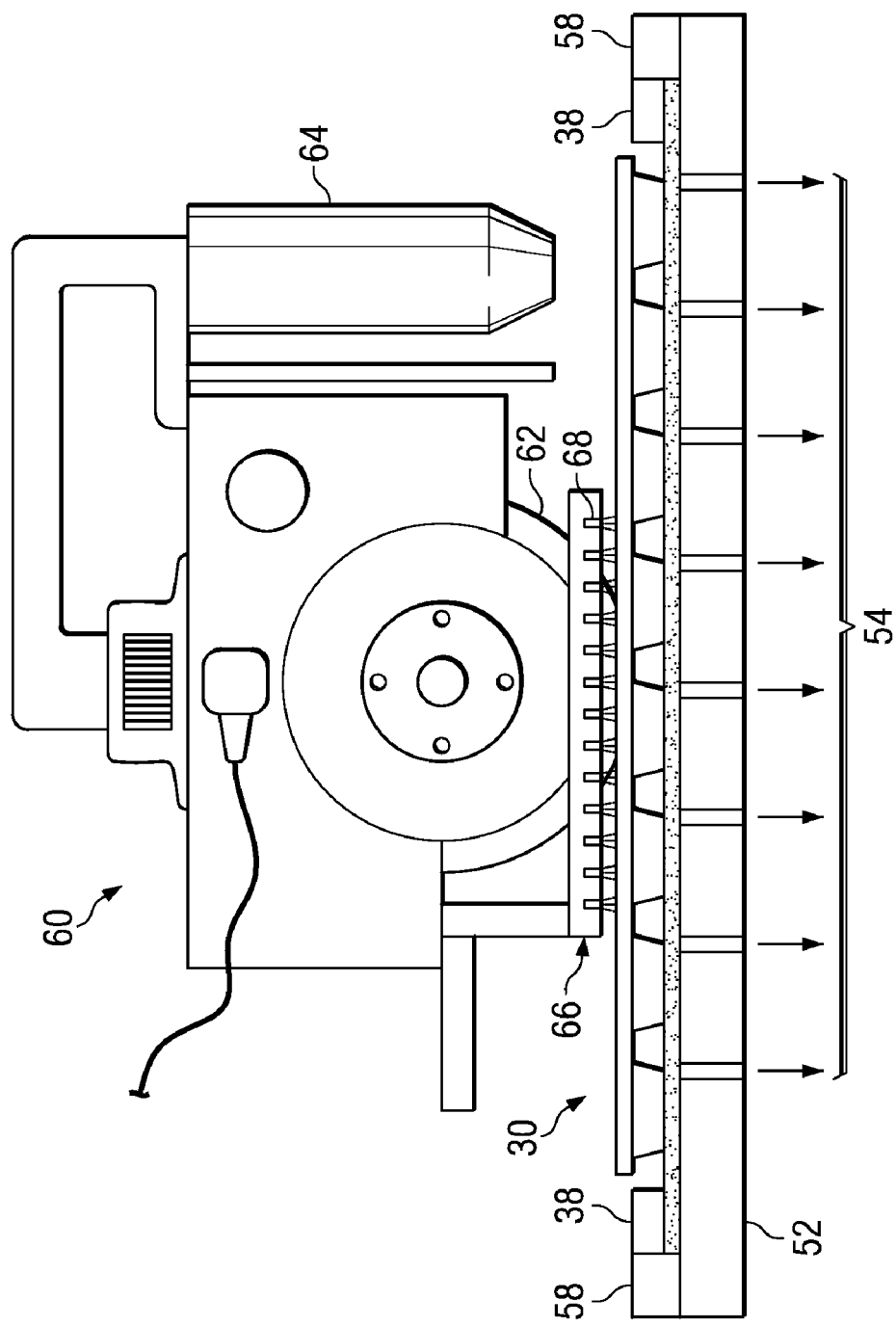
FIG. 2D is a side view illustrating a further continuation of method steps and system components in the example of a FIGS. 2A through 2C of a preferred embodiment of the invention.

Now referring primarily to FIG. 2A through FIG. 2E, method steps and system components of the invention are further described. A block-molded array 30 of ICs typically includes a substrate 32 such as a metallic leadframe or multilayer substrate. Individual ICs 34 are contained within blocks 36 of mold compound. In preferred embodiments of the invention, one or more array 30 is mounted in a mounting ring 38 using light-sensitive adhesive tape 40. The light-sensitive adhesive tape 40, preferably UV tape, has a tacky side 42 for engaging the array 30 and mounting ring 38, and a reverse side 44. As shown in FIG. 2C, the mounted array 30 is exposed to a source of electromagnetic radiation of a wavelength suitable for causing the desired reaction in the light-sensitive tape. In this example, the output form a UV source 46 is directed toward the tacky side 42 of the tape 40. As can be seen in the Figures, some regions of the tacky side 42 of the tape 40 are exposed 48 to the UV light and other regions 50 are shielded by the array 30 and by the mounting ring 38. Exposure to the selected light source 46 is preferably maintained until the exposed regions 48 of the tape 40 lose or substantially lose their tackiness due to the action of the selected portion of the electromagnetic spectrum upon the tape adhesive.

Referring to FIG. 2D, a partially cutaway side view shows the mounting ring 38 containing the array 30 positioned on a cutting table 52. A cutting table 52 or platform is used to support the mounting ring 38 holding the block-molded array 30. The mounting ring is held in place by an arrangement typically including a frame 58 and a holding mechanism such as a the application of a vacuum 54 at the cutting table 52, although a mechanical holding contrivance such as a jig may alternatively be used. A spindle assembly 60 is positioned above the secured array 30 and is used to bring a rotating saw blade 62 into contact with the array 30 for cutting. An optical device such as a camera 64 is used to align and control the path of the saw blade 62. Nozzles 66 positioned near the saw blade 62 are typically used to cool the array 30 and saw blade 62 during sawing and for dispensing solvent 68 such as high pressure water or soapy water to wash away sawdust particles and debris (not shown) generated by the sawing process. It should be appreciated that, using the systems and methods of the invention, there is little or no tacky tape surface exposed during sawing. This enhances the effectiveness of the washing process in clearing sawdust and other debris generated during sawing.

Subsequent to cutting, as shown in FIG. 2D, the mounting ring 38 holding the cut array 30 is exposed to a UV light source 46. In this instance, the mounting ring 38 is oriented such that the UV light strikes the tape 40 from the back side 44, thus there are no shielded regions, and the surface of the tape 40 is preferably entirely exposed. As can be seen in the side view of FIG. 2E, following exposure to UV light sufficient to eliminate or substantially diminish the adhesive properties of the tape 40, the individual singulated packages 56 may be removed for further processing.

The invention provides advantages including but not limited to increasing sawing efficiency and reducing costs. While the invention has been described with reference to certain illustrative embodiments, the methods and systems described are not intended to be construed in a limiting sense. Various modifications and combinations of the illustrative embodiments as well as other advantages and embodiments of the invention will be apparent to persons skilled in the art upon reference to the description and claims.

We claim

1. A method for singulating block-molded arrays of semiconductor devices comprising the steps of:
    providing a mounting ring for receiving a block-molded array of semiconductor devices;
    placing a block-molded array of semiconductor devices into the mounting ring and securing the array to the mounting ring with light-sensitive tape;
    exposing the array, mounting ring, and light-sensitive tape to tape-deactivating light, whereby the array acts to shield one or more regions of the light-sensitive tape from tape-deactivating light, and whereby one or more exposed regions of the light-sensitive tape are made less tacky by the action of the tape-deactivating light;
    securing the mounting ring containing the secured array on a cutting table, the taped side of the array adjacent to the cutting table; and
    cutting the array to singulate devices.

2. A method according to claim 1 further comprising the step of exposing the taped side of the sawn array to tape-deactivating light, whereby the light-sensitive tape is made less tacky by the action of the tape-deactivating light such that the singulated devices may be removed.

3. A method according to claim 1 wherein the step of providing a mounting ring further comprises providing a mounting ring configured for receiving a plurality of block-molded arrays, and wherein subsequent steps are performed with a plurality of block-molded arrays.

4. A method according to claim 1 wherein the step of securing the mounting ring further comprises using a vacuum to secure the mounting ring to the cutting table.

5. A method according to claim 1 wherein the step of cutting the array to singulate devices further comprises sawing.

6. A method according to claim 1 wherein the step of exposing the array, mounting ring, and light-sensitive tape to tape-deactivating light, further comprises exposure to UV light.

7. A method according to claim 1 wherein the step of exposing the array, mounting ring, and light-sensitive tape to tape-deactivating light, further comprises exposure to IR light.

8. A method according to claim 1 wherein the step of exposing the array, mounting ring, and light-sensitive tape to tape-deactivating light, further comprises exposure to visible light.

9. A method for singulating block-molded arrays of semiconductor devices comprising the steps of:
    providing a mounting ring for receiving a block-molded array of semiconductor devices;
    placing a block-molded array of semiconductor devices into the mounting ring and securing the array to the mounting ring with light-sensitive tape;
    exposing the array, mounting ring, and light-sensitive tape to tape-deactivating light, whereby the array acts to shield one or more regions of the light-sensitive tape from tape-deactivating light, and whereby one or more exposed regions of the light-sensitive tape are made less tacky by the action of the tape-deactivating light;
    securing the mounting ring containing the secured array on a cutting table, the taped side of the array adjacent to the cutting table;
    cutting the array to singulate devices; and
    exposing the taped side of the sawn array to tape-deactivating light, whereby the light-sensitive tape is made less tacky by the action of the tape-deactivating light such that the singulated devices may be removed.

* * * * *